(12) United States Patent
Huang et al.

(10) Patent No.: US 9,537,057 B2
(45) Date of Patent: Jan. 3, 2017

(54) SURFACE-MOUNTED LIGHT-EMITTING DEVICE AND FABRICATION METHOD THEREOF

(71) Applicant: XIAMEN SANAN OPTOELECTRONICS TECHNOLOGY CO., LTD., Xiamen (CN)

(72) Inventors: Shaohua Huang, Xiamen (CN); Xiaoqiang Zeng, Xiamen (CN); Chih-Wei Chao, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 14/748,701

(22) Filed: Jun. 24, 2015

(65) Prior Publication Data

US 2015/0295142 A1 Oct. 15, 2015

Related U.S. Application Data

(63) Continuation of application No. PCT/CN2014/071079, filed on Jan. 22, 2014.

(30) Foreign Application Priority Data

May 24, 2013 (CN) .......................... 2013 1 0195976

(51) Int. Cl.
*H01L 33/48* (2010.01)
*H01L 33/38* (2010.01)
(Continued)

(52) U.S. Cl.
CPC ......... *H01L 33/486* (2013.01); *H01L 33/0095* (2013.01); *H01L 33/38* (2013.01);
(Continued)

(58) Field of Classification Search
None
See application file for complete search history.

(56) References Cited

U.S. PATENT DOCUMENTS

2009/0321778 A1* 12/2009 Chen ...................... H01L 24/81
257/99
2011/0241048 A1* 10/2011 Taguchi .................. H01L 33/60
257/98
(Continued)

FOREIGN PATENT DOCUMENTS

CN 102034925 A 4/2011
CN 102931322 A 2/2013

*Primary Examiner* — William Coleman
*Assistant Examiner* — Kien Ly
(74) *Attorney, Agent, or Firm* — Syncoda LLC; Feng Ma; Junjie Feng

(57) ABSTRACT

A surface-mounted light-emitting device includes: a LED epitaxial structure having two opposite surfaces, wherein the first surface is a light-emitting surface; P and N electrode pads over the second surface of the epitaxial structure, which have sufficient thickness to support the LED epitaxial structure, and the P and N electrode pads have two opposite surfaces respectively, in which, the first surface is approximate to the LED epitaxial structure; an insulator between the P and N pads to prevent the P and N electrode pads from short circuit; and the P and N electrode pads are directly applied in the SMT package. Some embodiments allow structural changes compared with conventional SMT package type by directly mounting the chip over the supporting substrate through an electrode pad. In addition, soldering is followed after the chip process without package step, which is mainly applicable to flip-chip LED device.

12 Claims, 17 Drawing Sheets

(51) Int. Cl.
*H01L 33/62* (2010.01)
*H01L 33/00* (2010.01)

(52) U.S. Cl.
CPC ...... *H01L 33/62* (2013.01); *H01L 2933/0016* (2013.01); *H01L 2933/0033* (2013.01); *H01L 2933/0091* (2013.01)

(56) References Cited

U.S. PATENT DOCUMENTS

| | | | |
|---|---|---|---|
| 2012/0193662 A1* | 8/2012 | Donofrio | H01L 33/60 257/98 |
| 2012/0313131 A1* | 12/2012 | Oda | H01L 21/6835 257/98 |
| 2012/0326200 A1* | 12/2012 | Shen | H01L 33/62 257/99 |
| 2013/0313590 A1* | 11/2013 | Akimoto | H01L 33/44 257/98 |
| 2014/0231858 A1* | 8/2014 | Lee | H01L 33/486 257/99 |
| 2014/0239331 A1* | 8/2014 | Oyu | H05K 13/046 257/98 |
| 2015/0115295 A1* | 4/2015 | Zeng | H01L 33/145 257/88 |
| 2015/0318444 A1* | 11/2015 | Huang | H01L 25/0753 257/99 |

\* cited by examiner

SURFACE-MOUNTED LIGHT-EMITTING DEVICE AND FABRICATION METHOD THEREOF

CROSS-REFERENCE TO RELATED APPLICATIONS

The present application is a continuation of, and claims priority to, PCT/CN2014/071079 filed on Jan. 22, 2014, which claims priority to Chinese Patent Application No. 201310195976.4 filed on May 24, 2013. The disclosures of these applications are hereby incorporated by reference in their entirety.

BACKGROUND

Surface-Mounted Technology (SMT) packaging is widely applied in existing LED light-emitting device, as shown in FIG. 1, to reduce thermal resistance of the device and to improve device stability; as in conventional method, conventional LED chip 100 is placed in the packaging body 120 and a pin 110 is led from the packaging body to make it directly mounted over the target board, e.g., PCB; in addition, phosphor may be coated over the packaging body to form a mixed-color light-emitting device. The SMT soldering method comprises eutectic soldering and reflow soldering.

SUMMARY

The present disclose provides a surface-mounted light-emitting device and fabrication thereof, which, in structure, changes conventional SMT package type by directly mounting the chip over the supporting substrate through an electrode pad. In addition, in terms of fabrication method, soldering is followed after the chip process without package step, which is mainly applicable to flip-chip LED device.

According to a first aspect of the present disclosure: a light emitting diode chip applicable to SMT is provided, comprising: a LED epitaxial structure having two opposite surfaces, in which, the first surface is a light-emitting surface; P and N electrode pads over the second surface of the epitaxial structure, which have sufficient thickness to support the LED epitaxial structure, and the P and N electrode pads have two opposite surfaces respectively, in which, the first surface is approximate to the LED epitaxial structure; an insulator between the P and N pads to prevent the P and N electrode pads from short circuit; and the P and N electrode pads are directly applied in the SMT package.

According to a second aspect of the present disclosure, a surface-mounted LED light-emitting device is provided, comprising a chip structure and a supporting substrate, in which, the chip structure comprises: a LED epitaxial structure having two opposite surfaces, in which, the first surface is a light-emitting surface; P and N electrode pads over the second surface of the epitaxial structure, which have sufficient thickness to support the LED epitaxial structure, and the P and N electrode pads have two opposite surfaces respectively, in which, the first surface is approximate to the LED epitaxial structure; an insulator between the P and N pads to prevent the P and N electrode pads from short circuit; and the chip is directly mounted over the supporting substrate via the P and N electrode pads through SMT package.

According to a third aspect of the present disclosure, a fabrication method of a surface-mounted LED light-emitting device is provided, comprising: 1) epitaxial growth: form a LED epitaxial structure over the growth substrate through epitaxial growth; 2) chip fabrication: determine P and N electrode regions and an isolating region over the LED epitaxial structure surface and fabricate P and N electrode pads and an insulator in each region, in which, the P and N electrode pads have sufficient thickness to support the LED epitaxial structure, and the insulator is formed between the P and N pads to prevent the P and N electrode pads from short circuit; remove the growth substrate and simplify the LED epitaxial structure to form a LED chip; 3) SMT package: provide a supporting substrate and directly mount the P and N electrode pads of the LED chip over the supporting substrate through SMT package to finally form a surface-mounted LED light-emitting device.

Specifically, the LED epitaxial structure is a flip-chip film structure. In some embodiments, a patterned passivating layer can be fabricated over the film LED surface. In some embodiments, phosphor can be coated over the film LED surface.

The P and N electrode pads have sufficient thickness to support the LED epitaxial structure. In some embodiments, the P electrode pad is thicker than 50 µm and the N electrode pad is also thicker than 50 µm. In some embodiments, the P and N electrode pads cover more than 80% of the entire luminous region and the remaining area is the insulator structure.

A gap D is formed between the P and N electrode pads. The insulator fills in the gap between the P and N electrode pads, and preferably, the insulator and the P and N electrode pads are closely jointed (basically, with no gap) to guarantee physical support of the epitaxial structure. In some embodiments, the insulator has two opposite surfaces, in which, the first surface is approximate to the LED epitaxial structure and the second surface extrudes beyond either second surface of the P and N electrode pads. The insulator extrudes the second surface of the electrode pad, which effectively avoids short circuit of the P and N electrodes in later SMT process of the chip. In some embodiments, the lower surface of the P and N electrode pads are at same level. It is assumed that height difference between lower surfaces of the P and N electrode pads and that of the insulator is H; and gap between the P and N electrode pads is D and H/D is 0.5-2. In some embodiments, gap D between the P and N electrode pads is 20-150 µm. In some embodiments, melting point or softening point of the insulator is lower than melting points of the P and N electrode pads and the insulator can be made of colloid material like SU8, BCB or dry film. In some embodiments, height difference H between lower surface of the insulator and those of the P and N electrode pads is 20 µm-150 µm.

The P and N electrode pads and the insulator basically cover the entire surface of the LED epitaxial structure. In some embodiments, edges of the P and N electrode pads are beyond that of the LED epitaxial structure with a certain distance to prevent the solder paste from climbing up the epitaxial layer due to solder paste backflow during chip SMT package, which may result in electric leakage of the device. Preferably, it is assumed that distance between edges of the P and N electrode pads are beyond that of the LED epitaxial structure is D, and minimum thickness of the P and N electrode pads is T, and D/T is 0.5-2. It is assumed that area of the epitaxial film layer is S1 and area of the pad layer that is beyond the epitaxial layer area is S2, and the ratio between S1 and S2 is 1/2-3/1, which is preferably 9/5. In some embodiments, distance that edges of the P and N electrode pads are beyond the LED epitaxial structure edge equals to or is larger than 30 um.

In some light-emitting devices of larger size, one important factor that influences device reliability is shape and size of the P and N electrode pads. For example, in a known asymmetric electrode design, large area difference of electrodes may lead to chip inclination during eutectic process, resulting in eutectic failure at electrodes of small areas and causing final electric connection failure. Therefore, for light-emitting devices of larger size, area ratio between the P and N electrode pads is preferably 6:4-1:1 (this ratio shall not restrict that the P electrode pad is larger than the N electrode pad) and most preferably, areas of the P and N electrode pads are same. In some embodiments, at least two insulating layers and one conducting layer are arranged between the P and N electrode pads and the LED epitaxial structure, in which, in the first insulating layer and the conducting layer, current is uniformly injected to the LED epitaxial structure, and in the second insulating layer, areas of the P and N electrode pads are basically same.

The light emitting diode chip applicable to SMT can be obtained by (but not restrictive to) the steps below: 1) provide a growth substrate, over which, grow a buffer layer, an N-type epitaxial layer, a light-emitting layer and a P-type epitaxial layer in successive; 2) pattern the epitaxial layer and etch part of the epitaxial layer to expose the N-type epitaxial layer; 3) form a high-reflectivity P-type ohmic contact layer over the P-type epitaxial layer and an N-type ohmic contact layer over the N-type epitaxial layer; 4) form an insulation paste isolating layer between the P-type ohmic contact layer and the N-type ohmic contact layer; 5) electroplate the P and N electrode pads to form an electroplating layer capable for supporting the epitaxy; 6) remove the growth substrate to expose the buffer epitaxial layer and determine grain size, and etch the epitaxial layer outside the determined region till the ohmic contact layers are exposed; 7) form a passivating layer over the buffer epitaxial layer and roughen its surface; and 8) coat phosphor material over the grain surface to form a fixed-color luminous chip, which can be directly applied in SMT mounting.

In some embodiments, when the LED chip is directly applied in SMT step, the supporting substrate surface is coated with a solder layer with thickness smaller or equaling to height difference between the second surface of the insulator and either second surface of the P and N electrode pads. The insulator is made of insulating colloid. Press the insulating colloid when the chip is aligned with the supporting substrate to further guarantee electric isolation between the P and N electrode pads during reflow soldering.

The fabrication method of the surface-mounted LED light-emitting device of the present disclosure simplifies conventional LED chip package process in SMT, i.e., after step 2), a special-structure chip is formed and directly soldered over the supporting substrate without packaging. In some embodiments, during chip fabrication, after the growth substrate is removed, etch the LED epitaxial structure to form a cutting path, and physically cut the electrode pads over the cutting path to ensure that edges of the P and N electrode pads are beyond that of the LED epitaxial structure with a certain distance, thereby forming a series of LED chips. The LED light-emitting device and fabrication method thereof disclosed in the present disclosure emits pre-package of the LED chip in conventional SMT process and saves much costs; in comparison to conventional flip chip, it is more reliable during reflow soldering; moreover, the conventional flip chip has no supporting substrate and the growth substrate can be hardly removed; in contrast, this LED light-emitting device can support the epitaxy thanks to thick electroplating pads and the growth substrate can be removed to improve luminous effect.

DETAILED DESCRIPTION

References will be made to the following drawings to give clear description of the LED device structure and fabrication method, including the preferred embodiments. It is to be understood that by those skilled in the art that various changes may be made therein without influencing the beneficial effects of the present disclosure. Therefore, the descriptions below shall be understood as widely known by those skilled in the art and are not meant to limit the scope of the invention.

According to some embodiments, a SMT light-emitting device and fabrication method thereof are provided by directly mounting the light emitting diode chip over the supporting substrate. In device structure, the P and N electrode pads of the chip have enough thickness to support the epitaxial structure, and an insulator with a lower surface lower than either lower surface of the P and N electrode pads is arranged between the P and N electrode pads, which supports the LED epitaxial structure and prevents the P and N electrode pads from short circuit when the chip is applied in soldering. In fabrication method, soldering is followed after the chip process without package step.

A detailed description will be given to the SMT light-emitting device and fabrication method.

Embodiment 1

Figure 1:
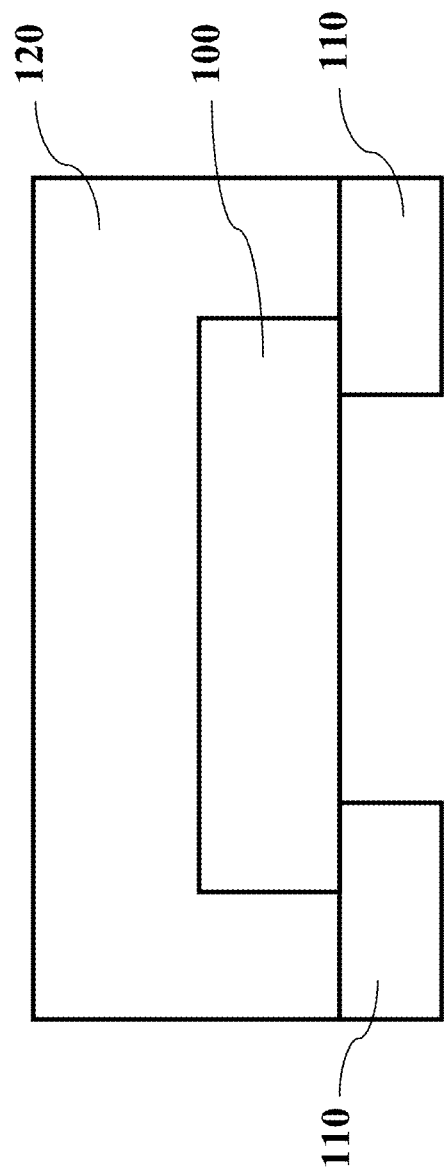
FIG. 1 is a simple structure diagram of a conventional SMT light-emitting device.
Figure 2:
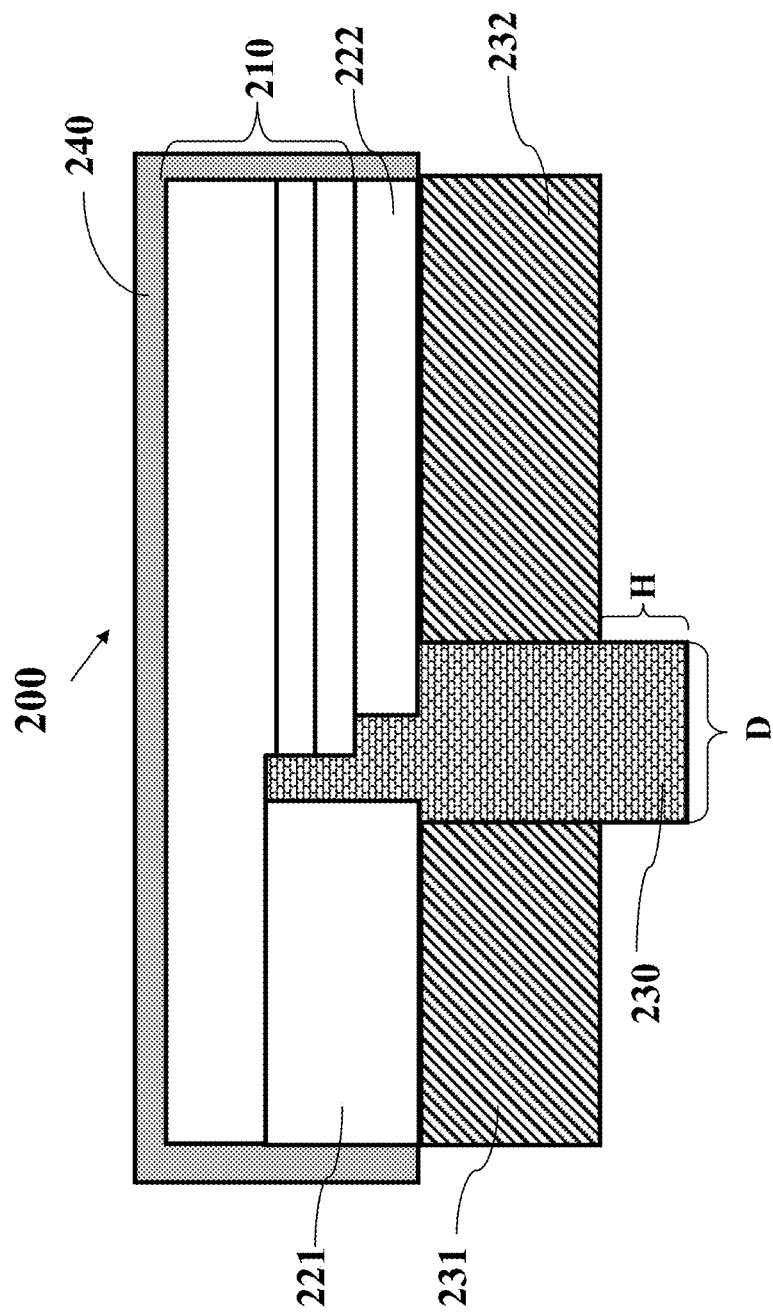
FIG. 2 is a structural section view according to Embodiment 1 of the present disclosure.

With reference to FIG. 2, a light emitting diode chip 200 applicable to SMT, comprising a luminous epitaxial laminated layer 210, ohmic contact layers 221, 222, electrode pads 231, 232 and an insulator 230. The luminous epitaxial laminated layer 210 is a flip-chip film structure, which from up to bottom comprises an N-type epitaxial layer, a light-emitting layer and a P-type epitaxial layer. However, it is not limited to the layers aforesaid. The N-type ohmic contact layer 221 and the P-type ohmic contact layer 222 are over the N-type epitaxial layer and the P-type epitaxial layer respectively with parallel lower surfaces, which may be made of Cr, Au, Ti, Ni, Ag, Pt or TiW or any of their combinations. As a preferred embodiment, a multi-layer structure of high-reflectivity metal material is provided for ohmic contact and mirror reflection at the same time. The P and N electrode pads 232 and 231, more than 50 μm thick, are over the P and N-type ohmic contact layers respectively, to support the flip-chip film structure 210, and the preferred thickness is 70-150 μm. The P and N electrode pads 232 and 231 can be made of Ti, Ni, Cu, Au, AuSn, SnCu, SnBi, AgSnCu or any of their combinations. The insulator 230 is between the P and N electrode pads 232 and 231 and fills in the gap between the N-type ohmic contact layer 221 and the P-type ohmic contact layer 222, in which, the lower surface, of stepped shape, is lower than those of the P and N electrode pads 232, 231 and is made of permanent insulating colloid like SU8, BCB, dry film, etc. As a preferred embodiment, the epitaxial layer surface is covered with a passivating layer 240 made of silicon nitride or silicon oxide.

In this embodiment, the P and N electrode pads have two functions: one is to support the LED epitaxial structure with sufficient thickness and area, in which, preferably, the area accounts for at least 80% of the epitaxial layer and the remaining area is insulator material; the second function is for direct application in the SMT package. To realize the aforesaid two functions, it is necessary to guarantee completeness of physical support of the LED epitaxial structure and to prevent the P and N electrode pads from short circuit at the same time. Therefore, the P and N electrode pads and the insulator basically cover the entire surface of the LED epitaxial structure and are closely jointed (basically, with no gap) to ensure completeness of the epitaxial structure support and to effectively avoid damage of the flip-chip epitaxial film. The insulator 230 extrudes the lower surface of the electrode pad, which effectively avoids short circuit of the P and N electrodes in later SMT process of the chip. Lower surfaces of the P and N electrode pads are at same level. It is assumed that height difference between the relative position of the lower surfaces of the electrode pads and that of the lower surface of the insulator is H and the gap between the P and N electrode pads is D, and implementation effect of the present embodiment can be optimized by adjusting H and D. In this embodiment, gap D between the P and N electrode pads is 20-150 μm, and height difference H is 20 μm-150 μm.

Embodiment 2

Figure 3:
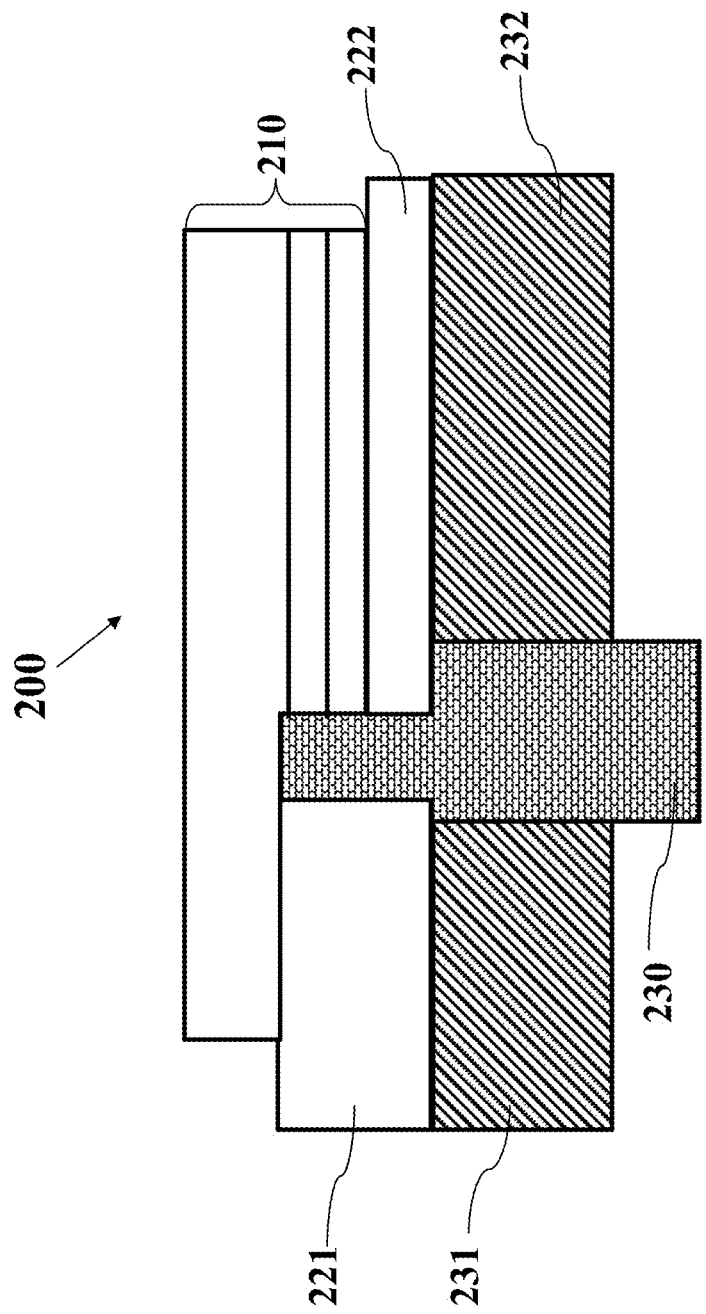
FIG. 3 is a structural section view according to Embodiment 2 of the present disclosure.

With reference to FIG. 3, this embodiment differs from Embodiment 1 mainly in that: Edges of the P and N electrode pads 232 and 231 are beyond that of the LED epitaxial structure 210 with a certain distance to prevent the solder paste from climbing up the epitaxial layer due to solder paste backflow during chip SMT package, which may result in electric leakage of the device. It is assumed that distance between edges of the P and N electrode pads are beyond that of the LED epitaxial structure is D, and minimum thickness of the P and N electrode pads is T. In general, as T increases, D increases accordingly, and in a preferred embodiment, D/T ratio is 0.5-2. It is assumed that area of the LED epitaxial structure 210 is S1 and area of the P and N electrode pads that is beyond the epitaxial layer is S2, and S1/S2 ratio is 1/2-3/1, and preferably 9/5. The above parameter ranges are only for reference and shall not be construed as limitation of the present disclosure.

Embodiment 3

In some light-emitting devices of larger size, one important factor that influences device reliability is shape and size of the P and N electrode pads. For example, in a known asymmetric electrode design, large area difference of electrodes may lead to chip inclination during eutectic process, resulting in eutectic failure at electrodes of small areas and causing final electric connection failure.

Figure 4:
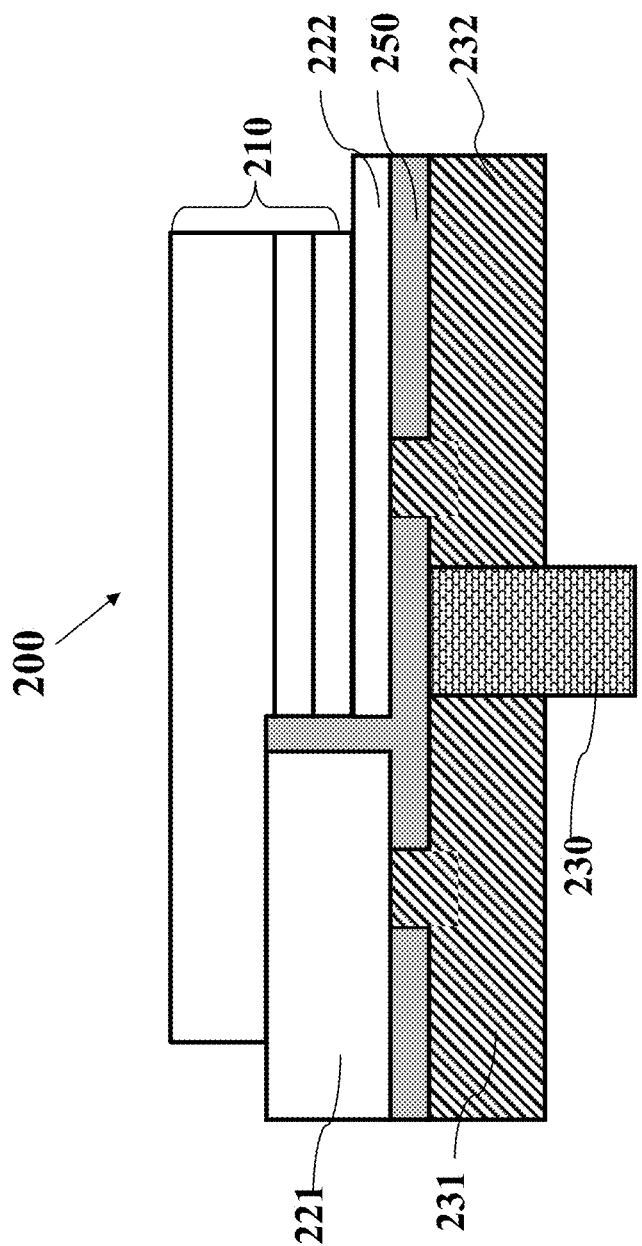
FIG. 4 is a structural section view according to Embodiment 3 of the present disclosure.

With reference to FIG. 4, difference between this embodiment and Embodiment 2 is that: the P and N electrode pads have approximate or basically same areas. Specifically, an insulating layer 250 is arranged between the P and N ohmic contact layers 232 and 231 to enable electric isolation between the N-type ohmic contact layer 231 and the light-emitting layer and the p-type semiconductor of the LED epitaxial structure. Open holes at positions of the insulating layer 250 corresponding to the P and N ohmic contact layers. The P and N electrode pads fill through this opening structure and contact with the P and N ohmic contact layers respectively.

Embodiment 4

Figure 5:
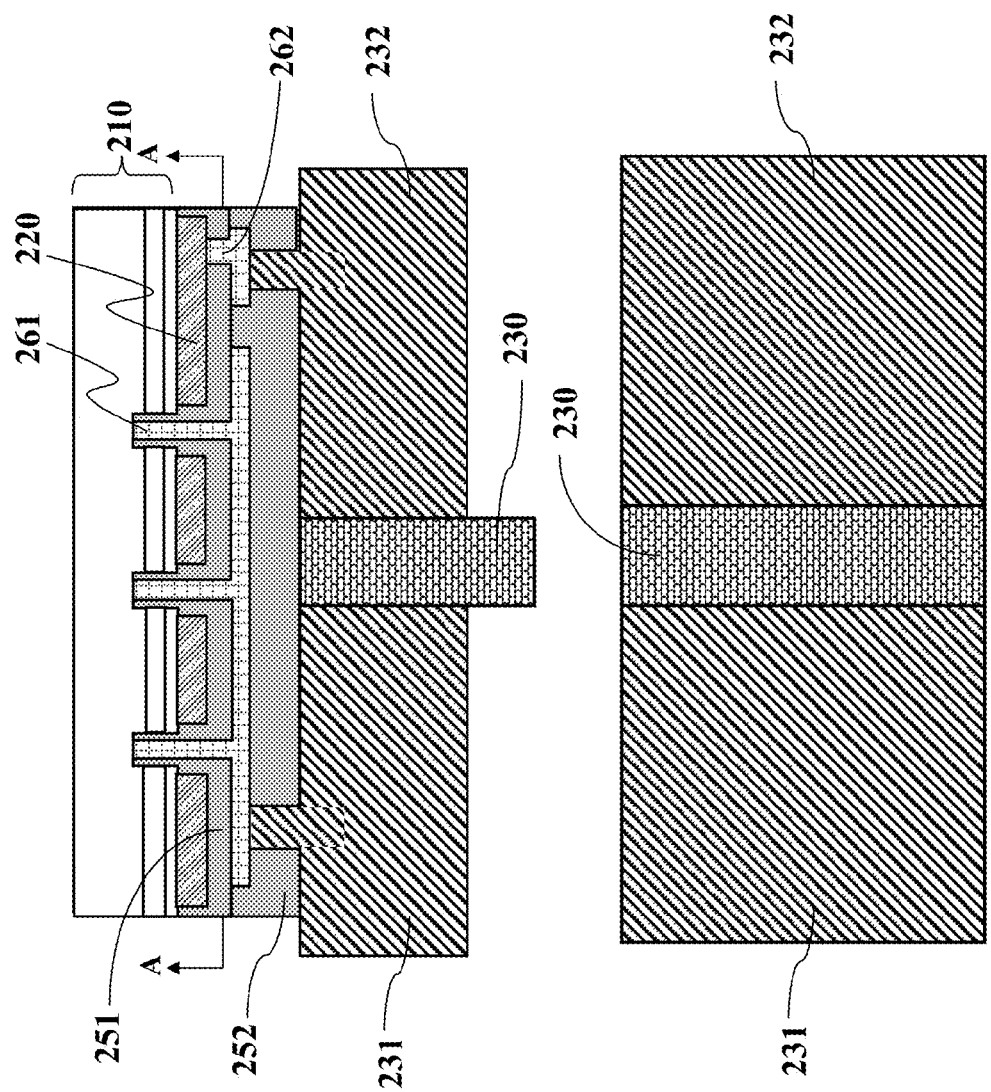
FIG. 5 illustrates sectional views of a device structure according to Embodiment 4 of the present disclosure.
Figure 6:
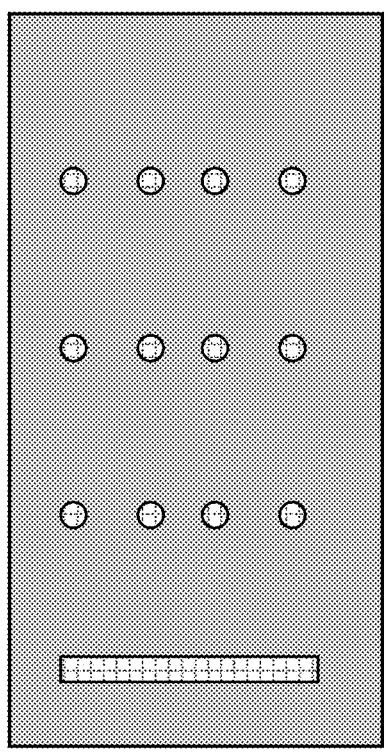
FIG. 6 illustrates another sectional view.

This embodiment optimizes the current injection structure of the LED epitaxial layer and differs from Embodiment 3 in that: a dual insulating layer and a conducting layer structure are arranged between the P and N ohmic contact layers and the P and N electrode pads, in which, in the first insulating layer and the conducting layer, current is uniformly injected to the LED epitaxial structure, and in the second insulating layer, areas of the P and N electrode pads are basically same. With reference to FIG. 5 and FIG. 6, in which, FIG. 6 is a section view along the first insulating layer 251. In the central regions of the LED epitaxial structure 210, open a plurality of first opening structures that pass through the P-type epitaxial layer, the light-emitting layer and till the N-type epitaxial layer; cover an ohmic contact layer 220 over the P-type epitaxial layer surface and cover the first insulating layer 251 over the ohmic contact layer 220 and also the side wall of the opening structure to expose the N-type epitaxial layer; open at least one second opening structure at the position of the first insulating layer 251 corresponding to the ohmic contact layer 220; fabricate the conducting layer, which is divided into an N conducting region 261 and a P conducting region 262, over the first insulating layer 251, in which, the N conducting region 261 contacts with the N-type epitaxial layer through the first opening structure and P conducting region 262 contacts with the ohmic contact layer 220 through the second opening structure; fabricate a second insulating layer 252 over the conducting layer and open a third opening structure at positions corresponding to the N conducting region 261 and the P conducting region 262, in which, the P and N electrode pads 232 and 231 fill in this opening structure and contact with the P and N conducting regions over the conducting layer respectively.

Embodiment 5

Figure 7:
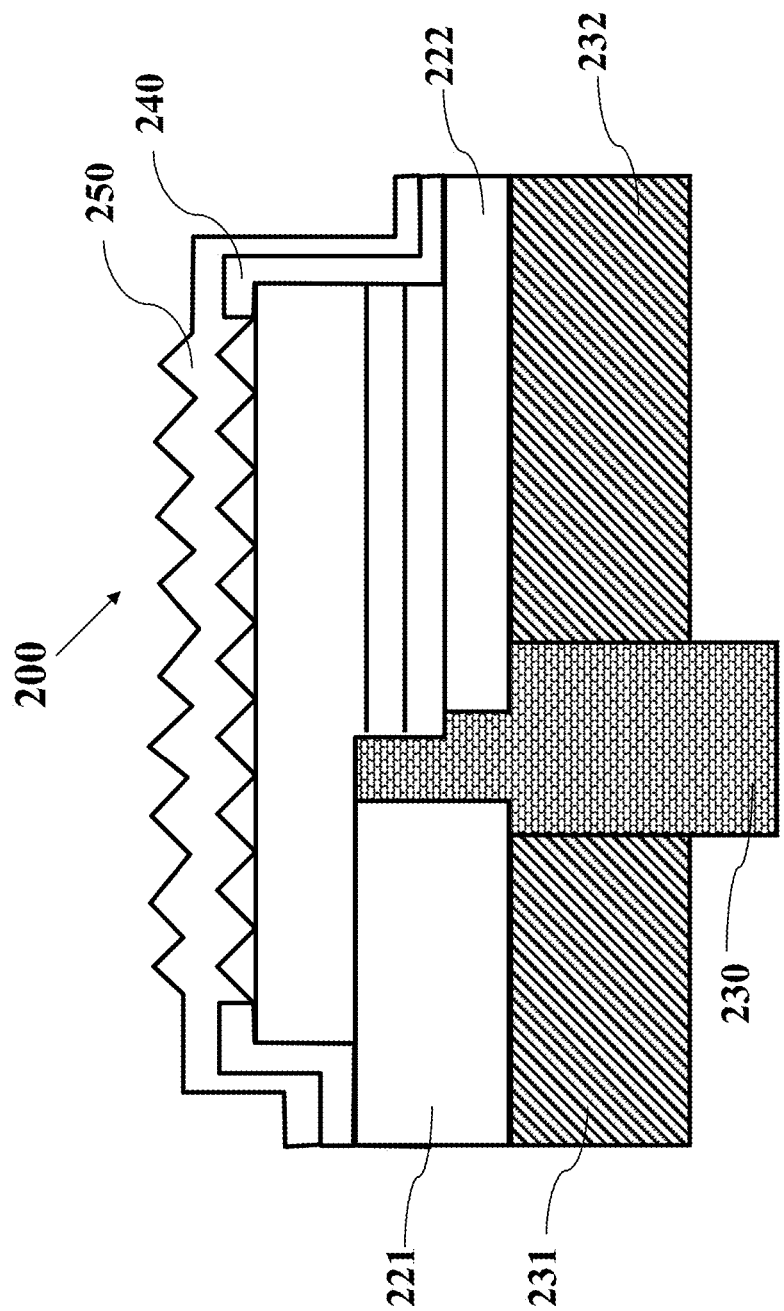
FIG. 7 is a structural section view according to Embodiment 5 of the present disclosure.

With reference to FIG. 7, this embodiment differs from Embodiment 2 mainly in that: the LED epitaxial structure surface is covered with a passivating layer 240 and a phosphor layer 250 is coated over the light-emitting surface. As a preferred embodiment, the light-emitting surface may be roughened.

Figure 8:
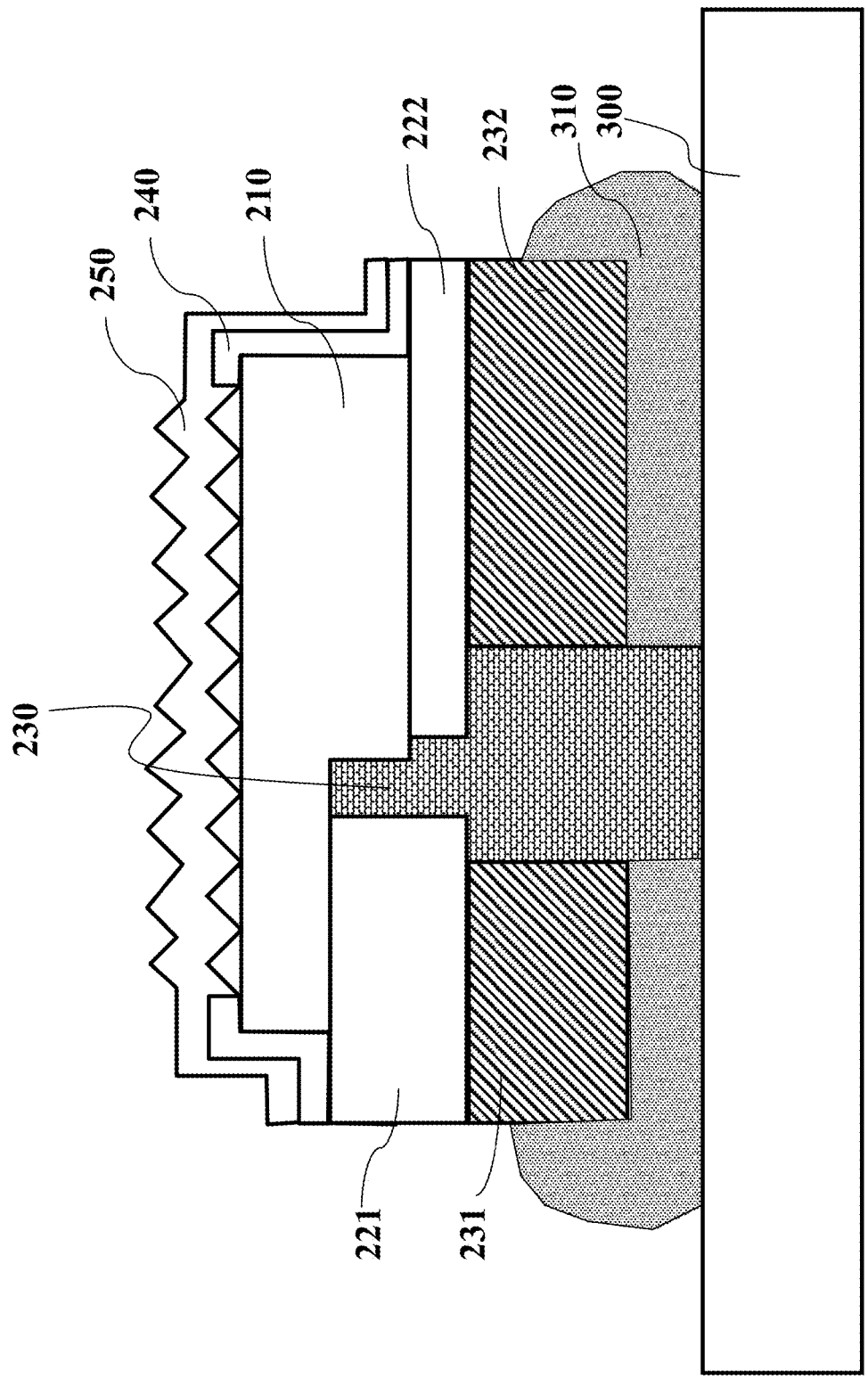
FIG. 8 shows a SMT light-emitting device fabricated from the light emitting diode chip according to FIG. 7.

With reference to FIG. 8, a SMT light-emitting device fabricated from the light emitting diode chip as shown in FIG. 7. The fabrication method comprises three processes: epitaxial growth, chip fabrication and SMT soldering. This fabrication of the SMT light-emitting device will be described in detail with reference to FIGS. 9-17.

Figure 9:
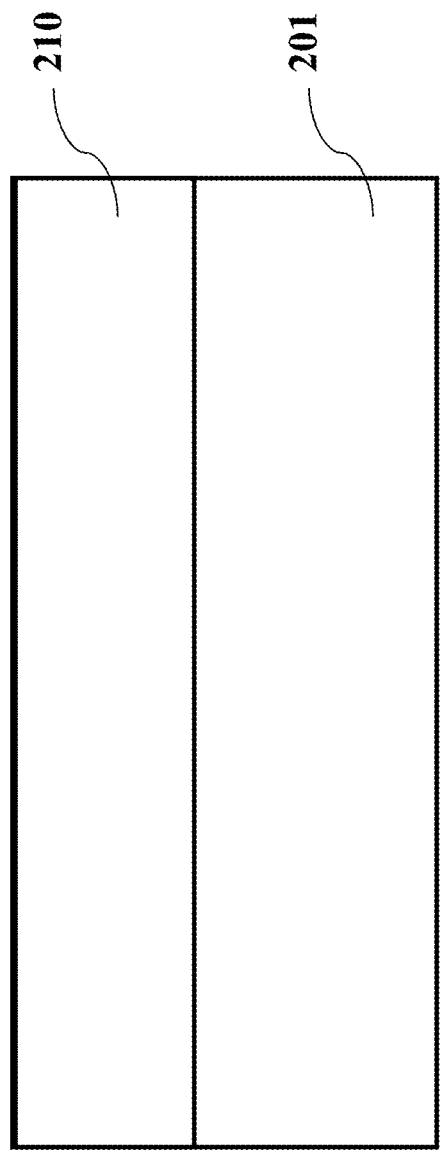
FIG. 9 illustrates a first step in the fabrication of the light-emitting device as shown in FIG. 7.

First step is epitaxial growth. Specifically: provide a growth substrate 201, over which, form a buffer layer, an N-type epitaxial layer, a light-emitting layer and a P-type epitaxial layer in successive, and this epitaxial laminated layer is 210, as shown in FIG. 9. This step can adopt conventional epitaxial growth process like MOCVD.

Figure 10:
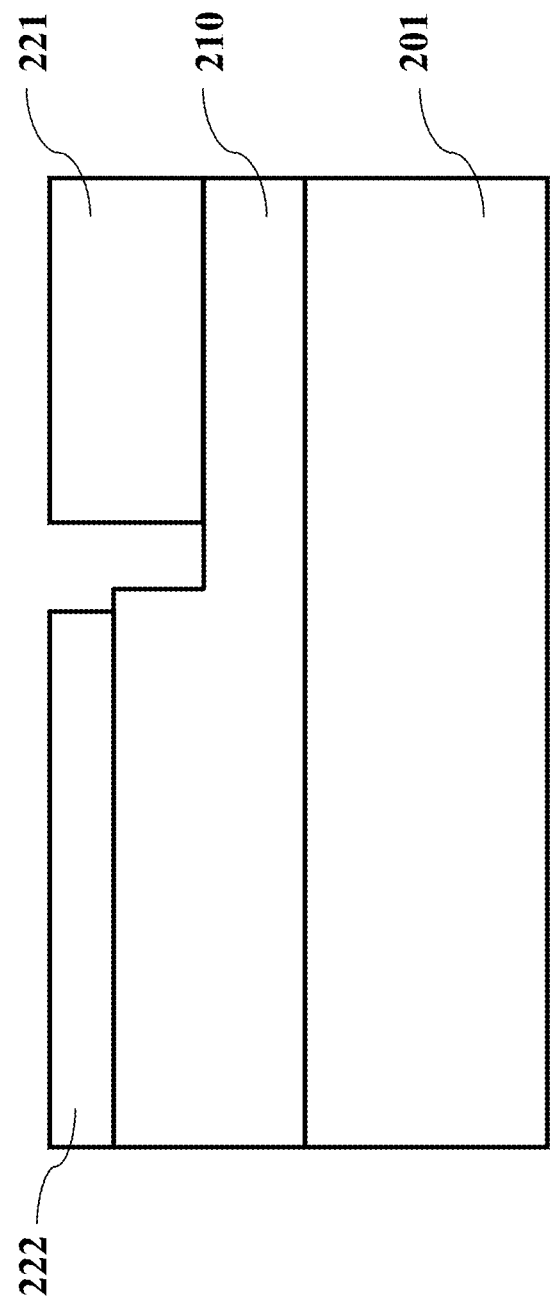
FIG. 10 illustrates a second step.
Figure 11:
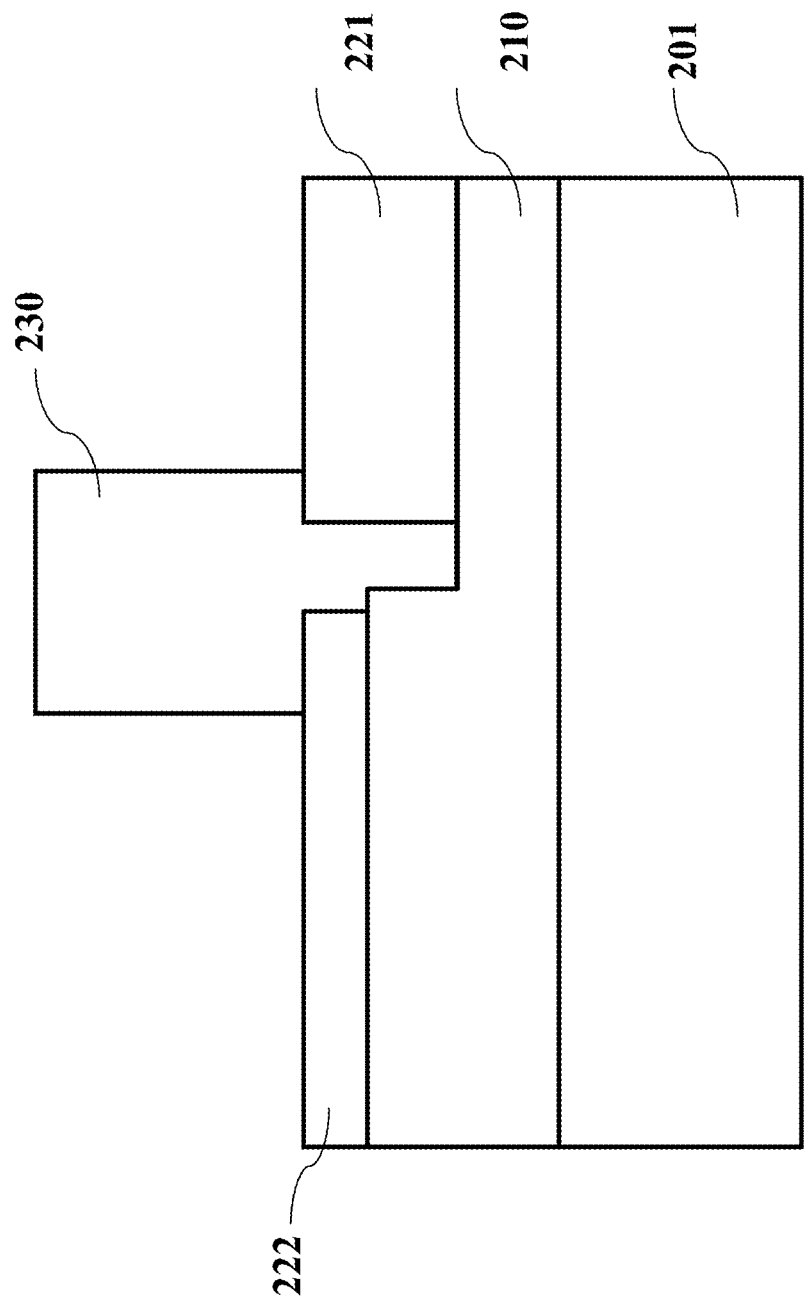
FIG. 11 illustrates a third step.
Figure 12:
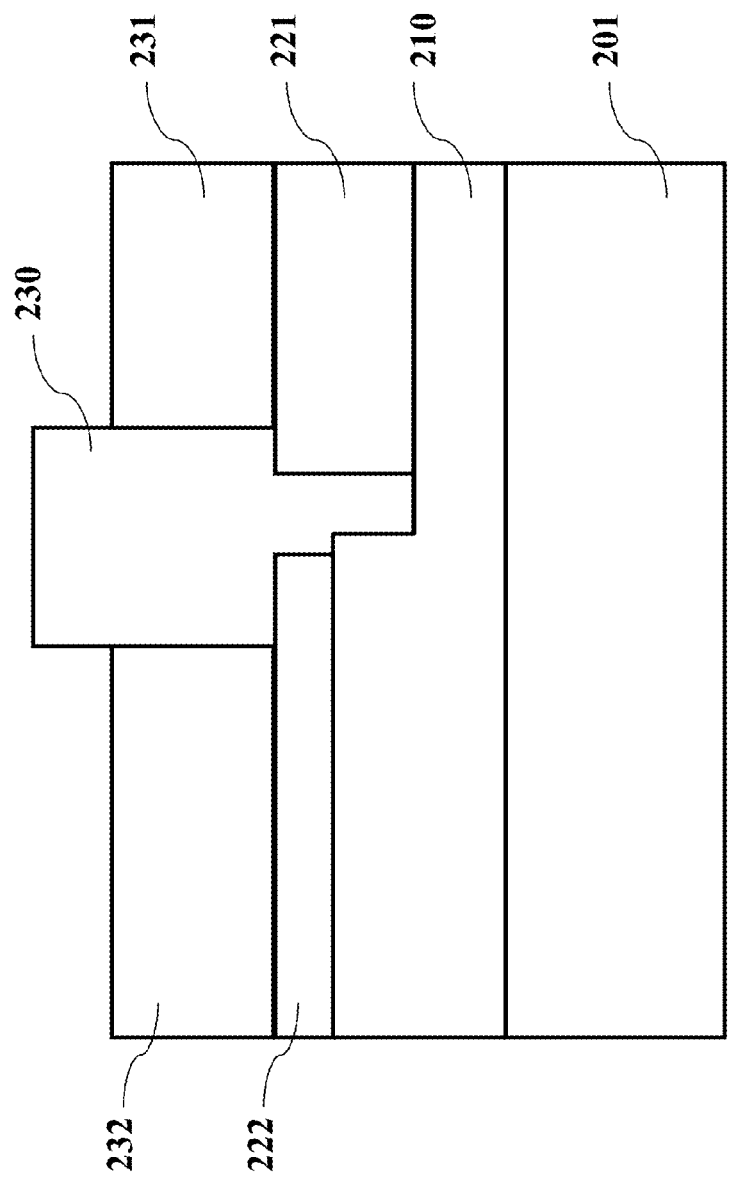
FIG. 12 illustrates a fourth step.
Figure 13:
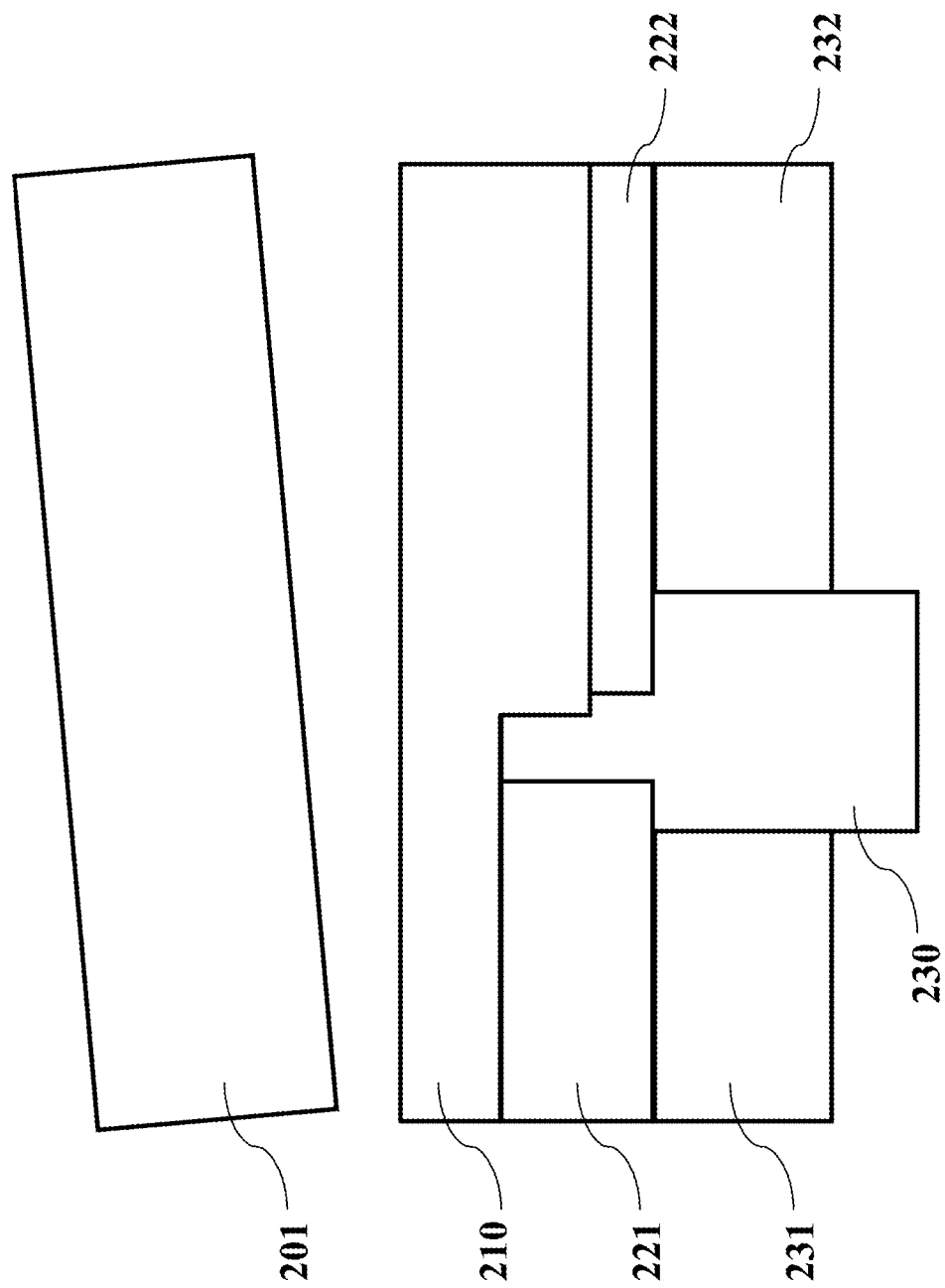
FIG. 13 illustrates a fourth step.
Figure 14:
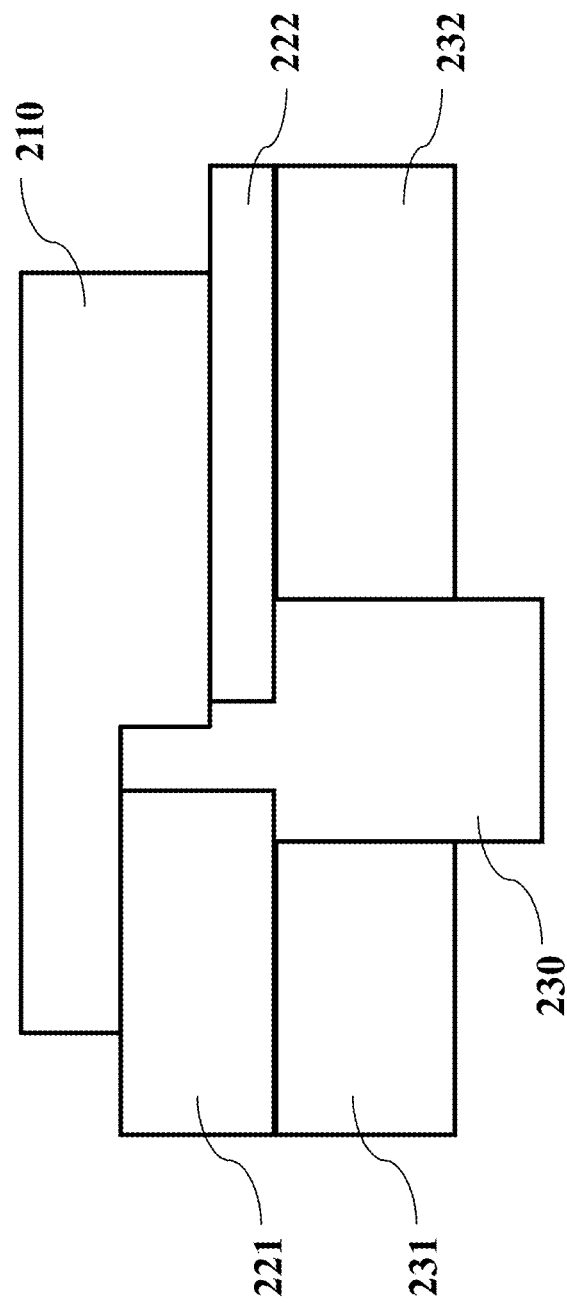
FIG. 14 illustrates a fifth step.
Figure 15:
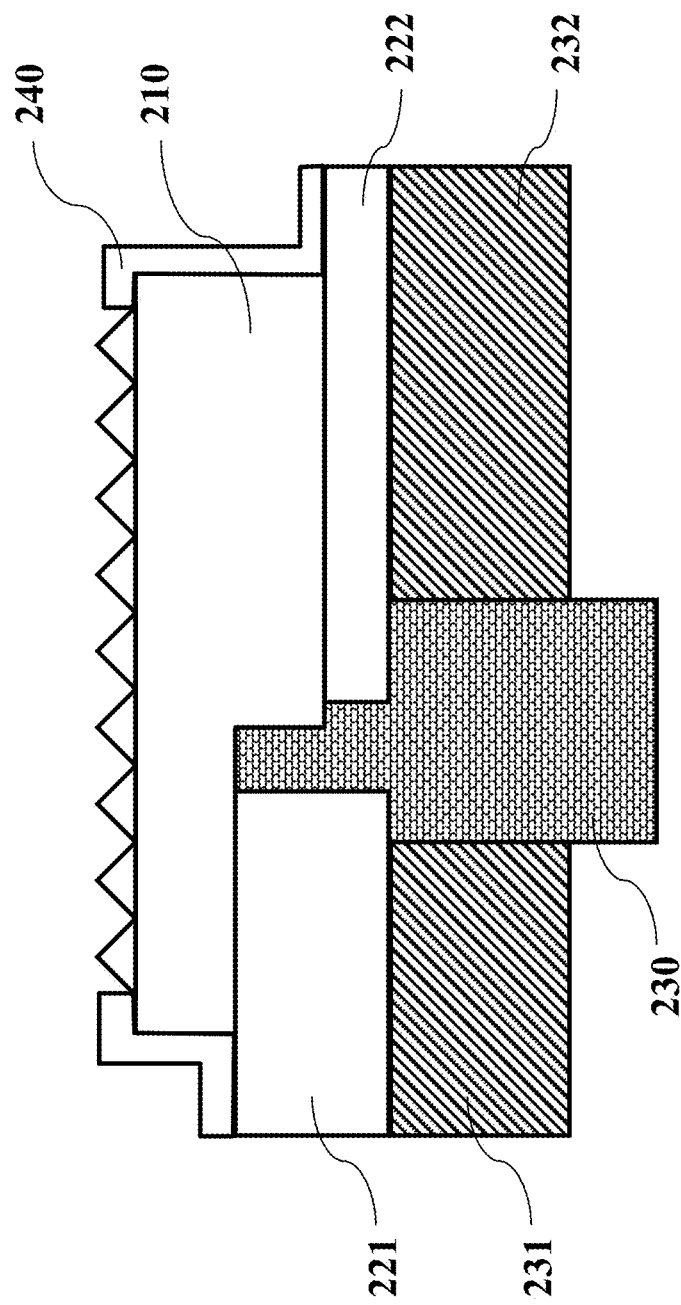
FIG. 15 illustrates a sixth step.
Figure 16:
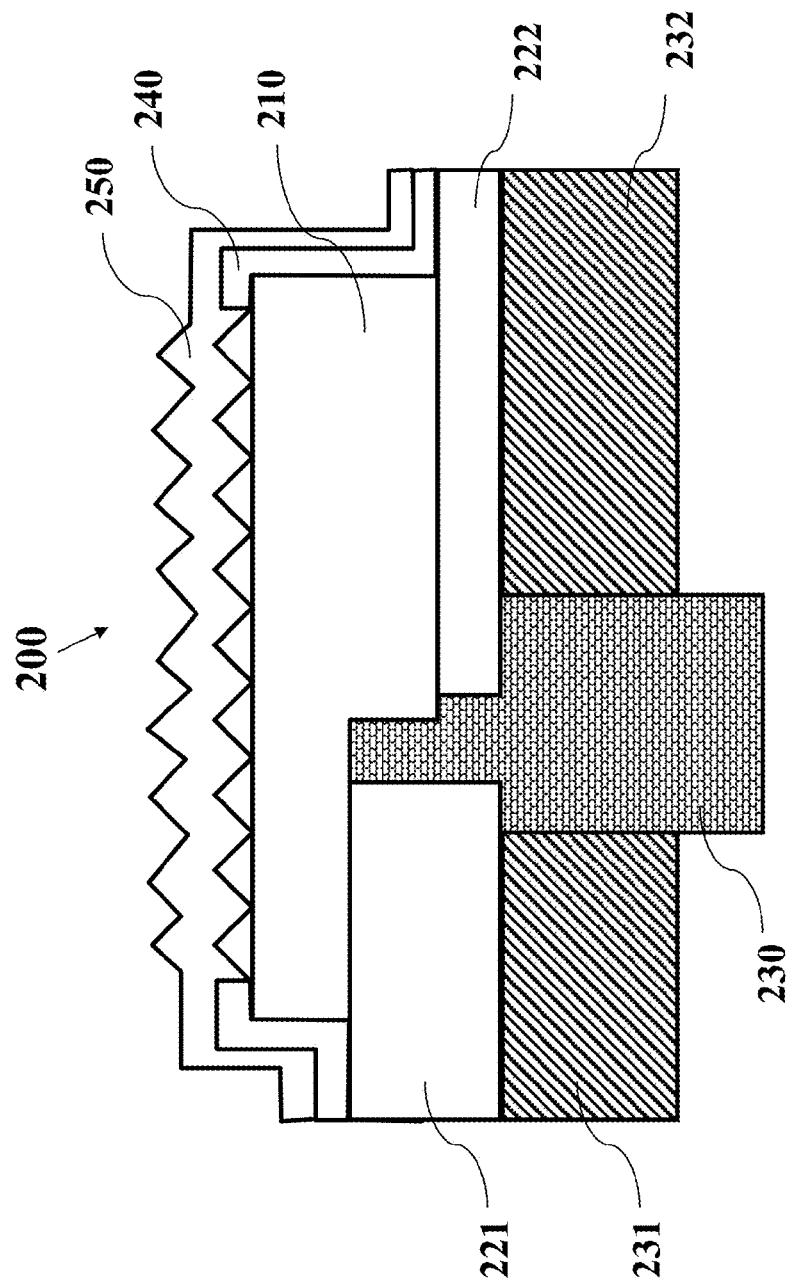
FIG. 16 illustrates a seventh step.
Figure 17:
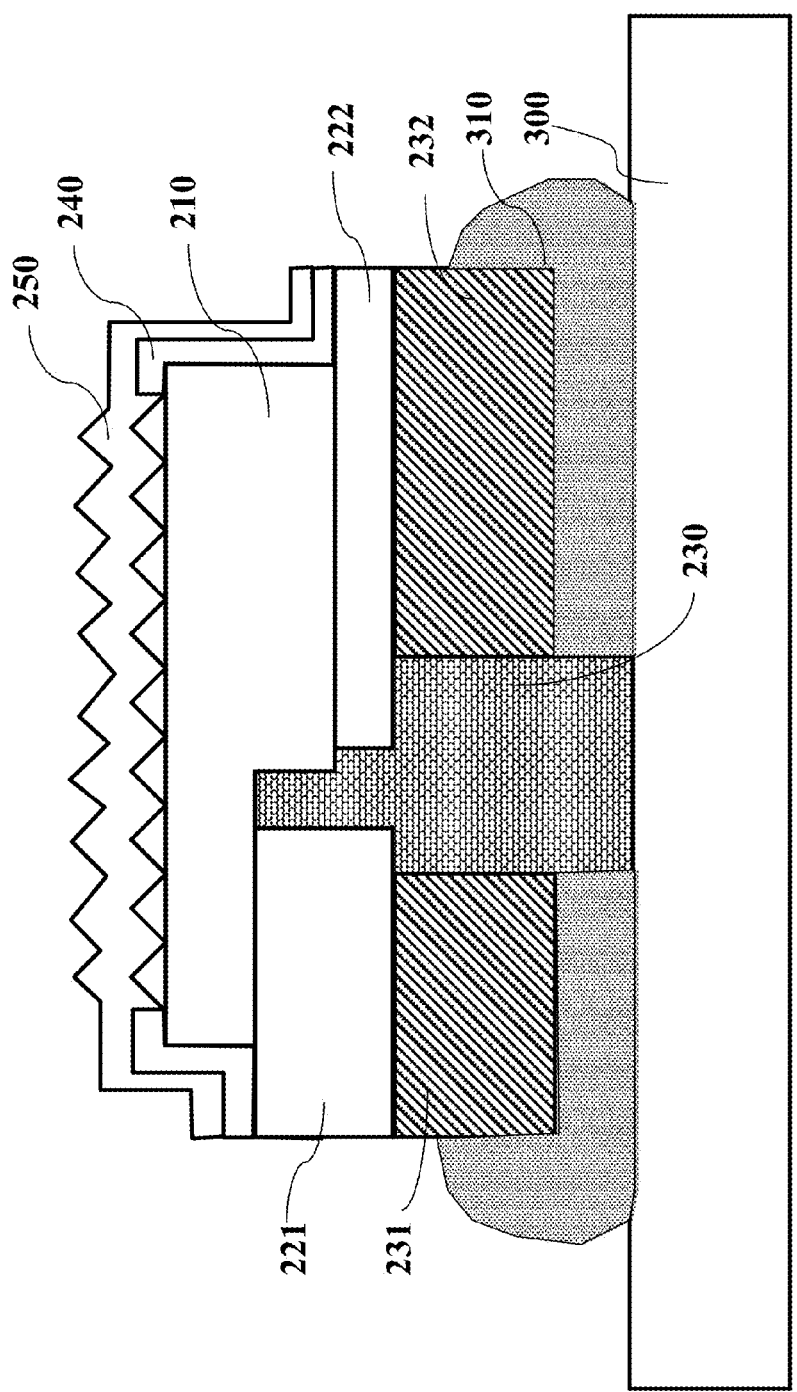
FIG. 17 illustrates an eighth step.

Next step is chip fabrication, comprising mesa etching, fabrication of ohmic contact layer, insulator and electrode pad and simplification treatment. Specifically: 1) pattern the epitaxial layer 210 through yellow-light photolithography technology and etch part of the epitaxial layer through ICP dry etching to expose the N-type epitaxial layer with etching depth about 1 µm; 2) evaporate a high-reflectivity P-type ohmic contact layer 222 through vacuum electron beam over the P-type epitaxial layer and the metal layer may comprise any one or several of Cr, Ag, Ni, Al, Pt, Au, Ti, TiW with total thickness not more than 0.5 µm and preferred thickness of 1 µm; form an N-type ohmic contact layer 221 over the N-type epitaxial layer and the metal layer may comprise any one or several of Cr, Ag, Ni, Al, Pt, Au, Ti, TiW with total thickness not more than 1.5 µm and preferred thickness of 2 µm; the two contact metals always keep same height, as shown in FIG. 10; 3) form a dry-film photoresist isolating layer as the insulator 230 between the P-type contact layer and the N-type contact layer through dry film photoresist process with height not less than 70 µm and preferred height of 120 µm, as shown in FIG. 11; 4) electroplate a thick P-type electrode pad layer 232 over the P-type ohmic contact layer 222 and a thick N-type electrode pad layer 231 not less than 50 µm thick over the N-type ohmic contact layer 221 through electroplating with material of Ni, Cu, Au, Ag or other metal material eutectic melt with Sn and form an electroplating layer capable for supporting the epitaxy, as shown in FIG. 12; 5) remove the growth substrate 201 through laser lifting-off to expose the epitaxial layer; determine each grain size through yellow-light photolithography and etch the epitaxial layer outside the determined region through ICP dry etching until the P-type ohmic contact layer 222 and the N-type ohmic contact layer 221 are exposed, as shown in FIG. 13; 6) based on chip size, etch the LED epitaxial structure to form a cutting path through dry etching or wet etching; 7) form a passivating layer 240, made of Si oxide or nitride, over the exposed epitaxial layer and form a nano-scale roughening structure over the surface through dry etching or wet etching, as shown in FIG. 15; 8) coat phosphor material 250 over the grain surface through the phosphor coating technology; and 9) physically cut the electrode pad layer along the cutting path to simplify the luminous structure and form the LED chip. And the chip fabrication step is finished. As shown in FIG. 16, the LED chip can be directly applied in SMT.

Lastly, pack the fabricated LED chip fabricated over a supporting substrate with conventional SMT soldering step. Specifically: 1) provide a supporting substrate and place the solder paste in specific region of the supporting substrate through metal stencil printing or silk-screen printing, in which, the specific region has P and N joints; 2) place the aforesaid LED chip over the supporting substrate to make the P and N electrode pads correspond to the P and N joints over the supporting substrate; 3) place the supporting substrate well-placed over the LED into the reflow soldering equipment for reflow soldering so as to form a surface-mounted LED light-emitting device, in which, the supporting substrate is MCPCB structure; reflow soldering temperature is 280-320° C.; the solder paste is thicker than 30 µm and the metal stencil printing or silk-screen printing is thicker than the solder paste.

In this embodiment, height from which the insulator 230 extrudes the P and N electrode pads is larger than the solder paste thickness, which ensures electric isolation between the P and N electrode pads during reflow soldering when the chip is aligned with the supporting substrate.

In this embodiment, etch the LED epitaxial structure to form a cutting path, and physically cut the electrode pads over the cutting path to ensure that edges of the P and N electrode pads are beyond that of the LED epitaxial structure with a certain distance, thereby forming a series of LED chips.

This embodiment emits pre-package of the LED chip in conventional SMT process and saves much costs; in comparison to conventional flip chip, it is more reliable during reflow soldering; moreover, the conventional flip chip has no supporting substrate and the growth substrate can be hardly removed; in contrast, this LED light-emitting device can support the epitaxial layer thanks to thick electroplating pads and the growth substrate can be removed to improve luminous effect.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A surface-mounted LED light-emitting device, comprising:
   an LED epitaxial structure having opposite a first surface and a second surface, wherein the first surface is a light-emitting surface;
   P and N electrode pads over the second surface of the epitaxial structure, which has a sufficient thickness to support the LED epitaxial structure, and the P and N electrode pads each have opposite a first electrode surface and a second electrode surface, respectively, wherein the first electrode surface is adjacent to the LED epitaxial structure;
   an insulator between the P and N electrode pads to prevent the P and N electrode pads from a short circuit;
   a supporting substrate; and
   a solder layer in contact with and between the supporting substrate and the P and N electrode pads;
   wherein a chip structure including the LED epitaxial structure, the P and N electrode pads, and the insulator is directly mounted over the supporting substrate via the P and N electrode pads through SMT packaging; and wherein the insulator extends through the solder layer and is in contact with the solder layer and the supporting substrate;

wherein the insulator has opposite a first and a second insulator surfaces, wherein the first insulator surface is adjacent to the LED epitaxial structure and the second insulator surface extrudes beyond either of the second electrode surfaces of the P and N electrode pads to prevent the P and N electrode pads from a short circuit when directly applied in the SMT package, wherein a distance between edges of the P and N electrode pads beyond that of the LED epitaxial structure is D, a minimum thickness of the P and N electrode pads is T, and wherein D/T is 0.5-2.

2. The light-emitting device of claim 1, wherein a melting point or softening point of the insulator is lower than melting points of the P and N electrode pads, wherein an area of the epitaxial structure is S1 and an area of the P and N electrode pads that is beyond the epitaxial structure area is S2, and wherein a ratio between S1 and S2 is 1/2-3/1.

3. The light-emitting device of claim 2, wherein the insulator comprises a colloid material, and wherein the ratio between S1 and S2 is 9/5.

4. The light-emitting device of claim 1, wherein a height difference between the second insulator surface and either of the second electrode surfaces of the P and N electrode pads is 20 μm-100 μm, and wherein an area ratio between the P and N electrode pads is 6:4-1:1.

5. The light-emitting device of claim 1, wherein edges of the P and N electrode pads are beyond that of the LED epitaxial structure to serve as a supporting structure of the epitaxial structure.

6. The light-emitting device of claim 5, wherein a distance that edges of the P and N electrode pads are beyond that of the LED epitaxial structure is equal to or larger than 30 μm to prevent a side wall of LED epitaxial structure from short circuit when the P and N electrode pads are directly mounted over the supporting substrate via SMT soldering.

7. The light-emitting device of claim 1, wherein the second electrode surfaces of the P and N electrode pads are at the same level.

8. The light-emitting device of claim 1, wherein a gap between the P and N electrode pads is 20-150 μm.

9. The light-emitting device of claim 1, wherein the P and N electrode pads are thicker than 50 μm to support the LED epitaxial structure.

10. The light-emitting device of claim 1, wherein areas of the P and N electrode pads are substantially same.

11. The light-emitting device of claim 1, wherein the P and N electrode pads and the insulator cover an entire surface of the LED epitaxial structure.

12. The light-emitting device of claim 1, wherein the P and N electrode pads and the insulator are closely jointed.

* * * * *